United States Patent [19]

Miyamoto et al.

[11] Patent Number: 4,822,989

[45] Date of Patent: Apr. 18, 1989

[54] SEMICONDUCTOR DEVICE AND METHOD OF MANUFACTURING THEREOF

[75] Inventors: Keiji Miyamoto, Ibaragi; Atsushi Nakamura, Kokubunji; Tsuneo Satoh, Tachikawa; Kazuo Kojima, Tokorozawa; Masayuki Morita, Tokyo, all of Japan

[73] Assignee: Hitachi, Ltd., Tokyo, Japan

[21] Appl. No.: 52,386

[22] Filed: May 21, 1987

[30] Foreign Application Priority Data

May 21, 1986 [JP] Japan ................... 61-114590
May 26, 1986 [JP] Japan ................... 61-119220

[51] Int. Cl.⁴ ............................................. G06K 19/06
[52] U.S. Cl. ...................................... 235/492; 357/80; 357/72; 235/380; 235/488
[58] Field of Search ............... 235/380, 382, 443, 487, 235/492, 488, 379; 357/70, 80, 72

[56] References Cited

U.S. PATENT DOCUMENTS

| | | | |
|---|---|---|---|
| 3,702,464 | 11/1972 | Castrucci | 357/80 X |
| 4,056,681 | 11/1977 | Cook, Jr. | 357/80 |
| 4,142,287 | 3/1979 | Grabbe | 357/80 X |
| 4,222,516 | 9/1980 | Badet et al. | 357/72 X |
| 4,603,249 | 7/1986 | Hoppe et al. | 357/80 X |
| 4,691,225 | 9/1987 | Murakami et al. | 357/80 |

Primary Examiner—M. H. Paschall
Assistant Examiner—A. Jonathan Wysocki
Attorney, Agent, or Firm—Antonelli, Terry & Wands

[57] ABSTRACT

This invention concerns a semiconductor device of a tape carrier type and a method of manufacturing the same, wherein electroconductive layers made of the same material as that of lead terminals are disposed so as to substantially surround the circumferential edge of a hole for containing an IC chip with a predetermined gap as barrier portions for controlling the flowing range or the coating range on a carrier tape before coagulation of the coating material when the surface of said IC chip after being inserted into the IC chip-containing hole and connected with the lead terminals is coated with the coating material. The steps formed with the surface of the carrier tape and the barrier portions which substantially surround the circumferential edge of the hole at a predetermined gap thereby results in controlling the flowing range of the coating material before coagulation, by which the coating region on the surface of the IC chip, etc. with the coating material is made uniform and the scattering in the film thickness is minimized.

41 Claims, 6 Drawing Sheets

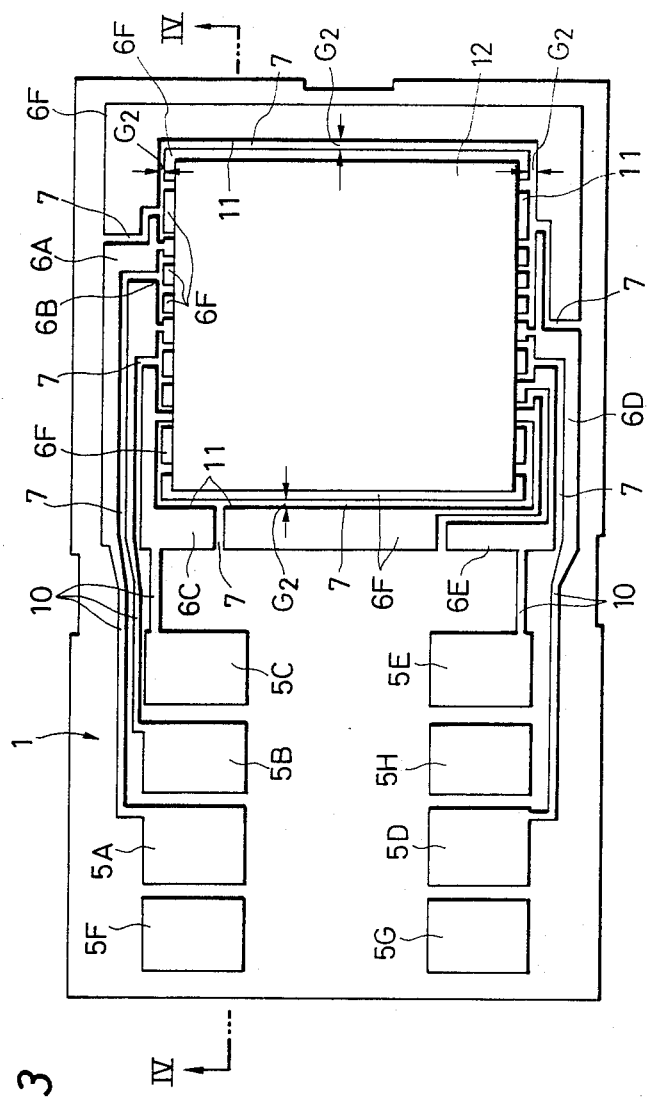
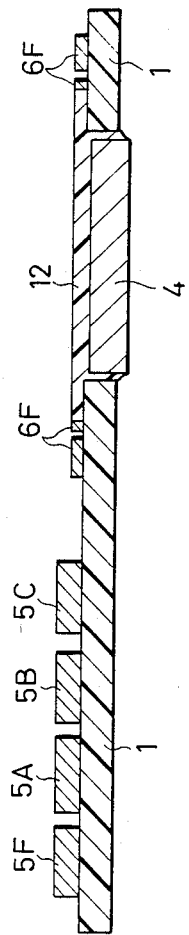
FIG. 3
FIG. 4

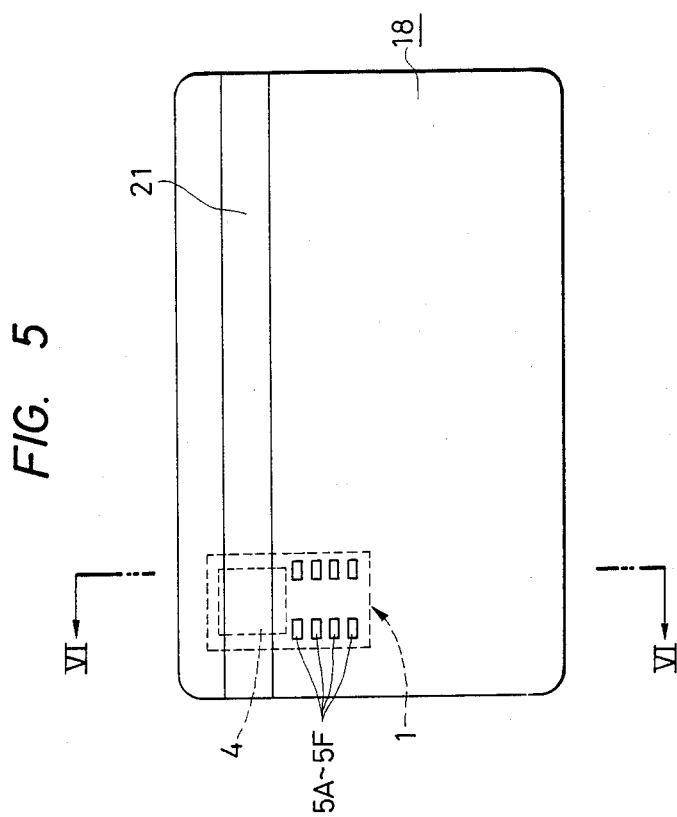
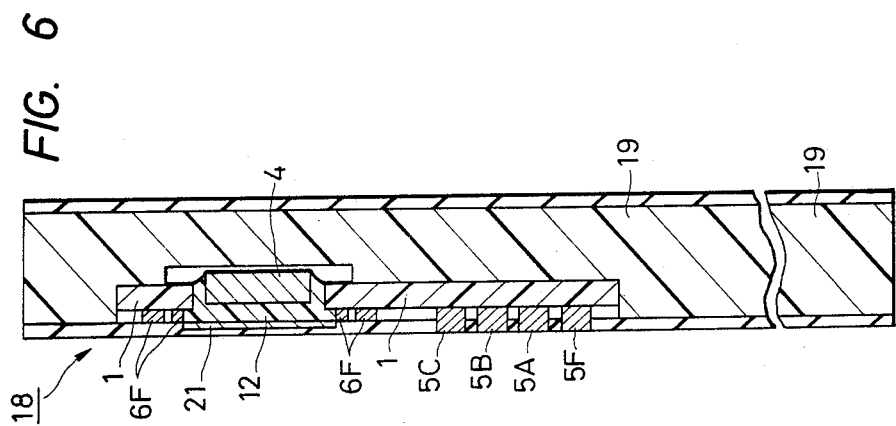

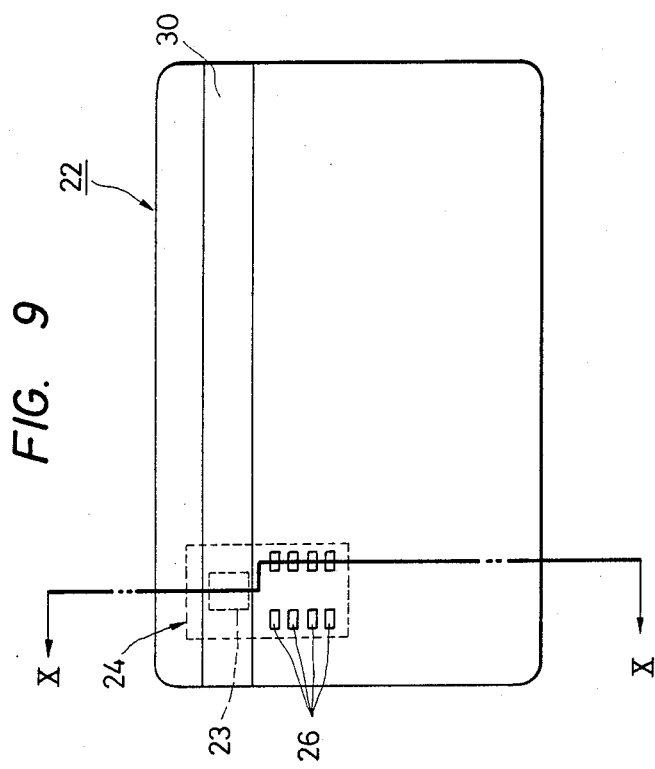
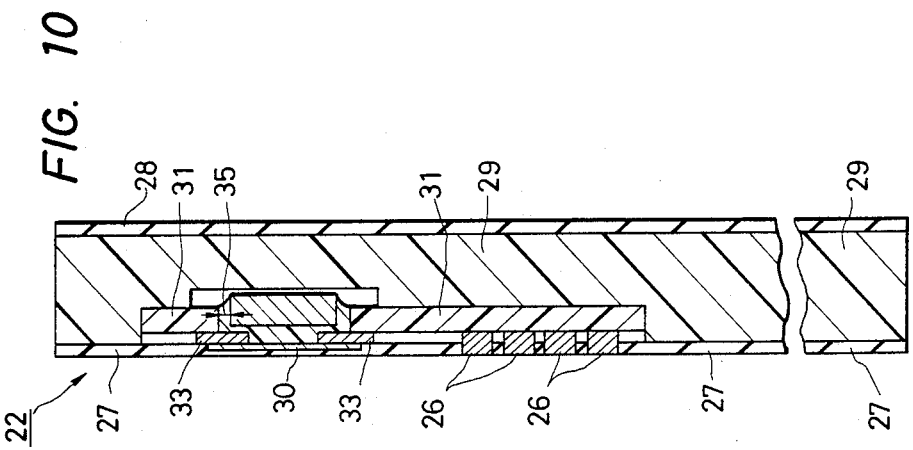

SEMICONDUCTOR DEVICE AND METHOD OF MANUFACTURING THEREOF

BACKGROUND OF THE INVENTION

This invention relates to a semiconductor device and a method of manufacturing thereof and it relates to a useful technique when applied, for example, to an IC card having semiconductor integrated circuits mounted thereon.

A tape carrier method has been known as a type of wireless bonding technique utilized for semiconductor integrated circuit chips. In such a tape carrier method, a wiring lead portion is formed by means of an electroconductive pattern on every one frame of a carrier tape formed in a cinema film-like shape by means of a polyimide resin or the like and electrode pads such as predetermined bump electrodes for the semiconductor integrated circuit chip are bonded to the lead terminals at the top end of the lead portion, as described for example, in LSI Handbook, p410 and 411 published from Ohm Co. on Nov. 30, 1984. The chip is coated and encapsulated as required with coating material such as a resin.

SUMMARY OF THE INVENTION

The present inventors have studied applying a semiconductor integrated circuit mounted to a carrier tape, by means of such a tape carrier method, to a memory card capable of increasing the memory capacity and extending the application range by mounted semiconductor memory circuits and data processing circuits, etc to conventional memory cards such as IC (integrated circuits) cards, that is, ID (identification) cards or credit card having only magnetic stripes. That is, a chip containing hole capable of inserting a semiconductor integrated circuit chip is passed through a carrier tape having required electroconductive pattern formed on one surface and electrode pads of a semiconductor integrated circuit chip which is bonded to the top end of the electroconductive pattern protruding to the inside of the hole and wherein the chip is coated with coating material. One unit of the semiconductor integrated circuit chip and the electroconductive pattern thus mounted is embedded into a card together with a carrier tape punched into a predetermined shape.

By the way, according to the efforts made by the present inventors, in the case where protecting layers are formed to the surface and a periphery of a semiconductor integrated circuit chip which are bonded to the lead terminals as described above by means of the resin coating method such as potting, the flowing range or coating range of the liquid resin varies due to the flowing property of the resin before coagulation, by which the thickness of the coating layer varies. The scattering of the thickness of the protection layers reflects on the irregular unevenness at the surface of a semiconductor device of the tape carrier type and, if the semiconductor device is embedded as it is in the card substrate, unevenness appears on the surface of the card. Further, in the case of a card adapted such that a magnetic stripe is disposed to that portion, the unevenness is also formed to the surface of such a magnetic stripe thereby bringing about a problem that accurate magnetic reading is no more possible.

Furthermore, in a semiconductor device having a thin package such as an IC card or card-shape electronic calculator, it has been known to mount an IC chip, that is, an IC pellet to a tape carrier and, further, mount the tape carrier to the inside of a card substrate. By the way, the electrode module as described above is assembled as follows. At first, wirings and external electrode terminals are formed by means of a metallized layer of a predetermined shape to the surface of a resin substrate which is a card substrate having a rectangular hole formed therein for containing the IC chip, and the IC chip bonded with leads is mounted to the substrate by means of the tape carrier system. After bonding the leads and the metallized layer in this way, a coating resin such as epoxy resin is deposited to the gap between the IC chip and the IC chip containing hole, as well as to the surface of the IC chip and the organic resin is solidified under heat treatment to complete the assembly for the semiconductor device.

However, in the structure of the semiconductor device as described above, the deposited synthetic resin can cause shrinkage due to heat treatment and, particularly, if the synthetic resin filled in the gap between the IC chip and the hole is solidified, unevenness may sometimes be formed to the solidified surface of the synthetic resin because of the reduction in the volume thereof.

In case that the unevenness at the surface of the synthetic resin on the tape carrier is large, the surface of the card is correspondingly formed into an uneven shape after the packaging to worsen the outer looking of the card.

Further, if the uneven portion appears to the magnetic stripe portion laminated and encapsulated to the card surface, it is considered that an error may be produced upon reading magnetic information in a card reader and, further, a difficulty may be introduced to the reading of the information. Further, the outer appearance of the IC card is worsened in the case where the portion is situated at a position other than at the magnetic stripe.

An object of this invention is to provide a semiconductor device capable of unifying the flowing range or the coating range of protection material or coating material comprising a resin for coating a semiconductor integrated circuit chip before coagulation, as well as a method of manufacturing thereof.

Another object of this invention is to provide a semiconductor device and capable of maintaining the surface flatness of an IC card, etc, as well as a method of manufacturing thereof.

These and other objects, as well as novel features of this invention will become apparent from the descriptions of the specification and appended drawings.

Explanation will be made briefly to the outline for typical embodiments of the invention disclosed in the present application.

Specifically, upon coating, with coating material, the surface of an IC chip which is to be inserted into an IC chip containing hole and to bonded to lead terminals, an electroconductive layer made of the same material as the lead terminals is formed so as to substantially surround the circumferential edge of the hole at a predetermined gap and used as a barrier for controlling the flowing range or the coating range before coagulation of the coating material on the carrier tape.

According to the means as described above, since a step constituted with the surface of the carrier tape and the barrier portion substantially surrounds the circumferential edge of the hole at a predetermined gap, the flowing range of the coating material before coagulation is controlled at such a step, by which the coating region, for example, at the surface of the IC chip made of the coating material is made uniform and the scattering in the layer thickness is minimized.

BRIEF DESCRIPTION OF THE DRAWINGS

FIG. 3 is a plan view of individual semiconductor devices illustrating the state where the tape carried state in FIG. 2 is rendered into the state of individual semiconductor devices;

FIG. 4 is a cross sectional view taken along line IV—IV in FIG. 3;

FIG. 5 is a plan view showing an IC card and

FIG. 6 is a cross sectional view taken along line VI—VI in FIG. 5;

FIG. 9 is a plan view of an IC card incorporated with the semiconductor device shown in FIG. 7 and FIG. 10 is a cross sectional view taken along line X—X in FIG. 9.

DESCRIPTION OF THE PREFERRED EMBODIMENTS

Example 1

Figure 1:
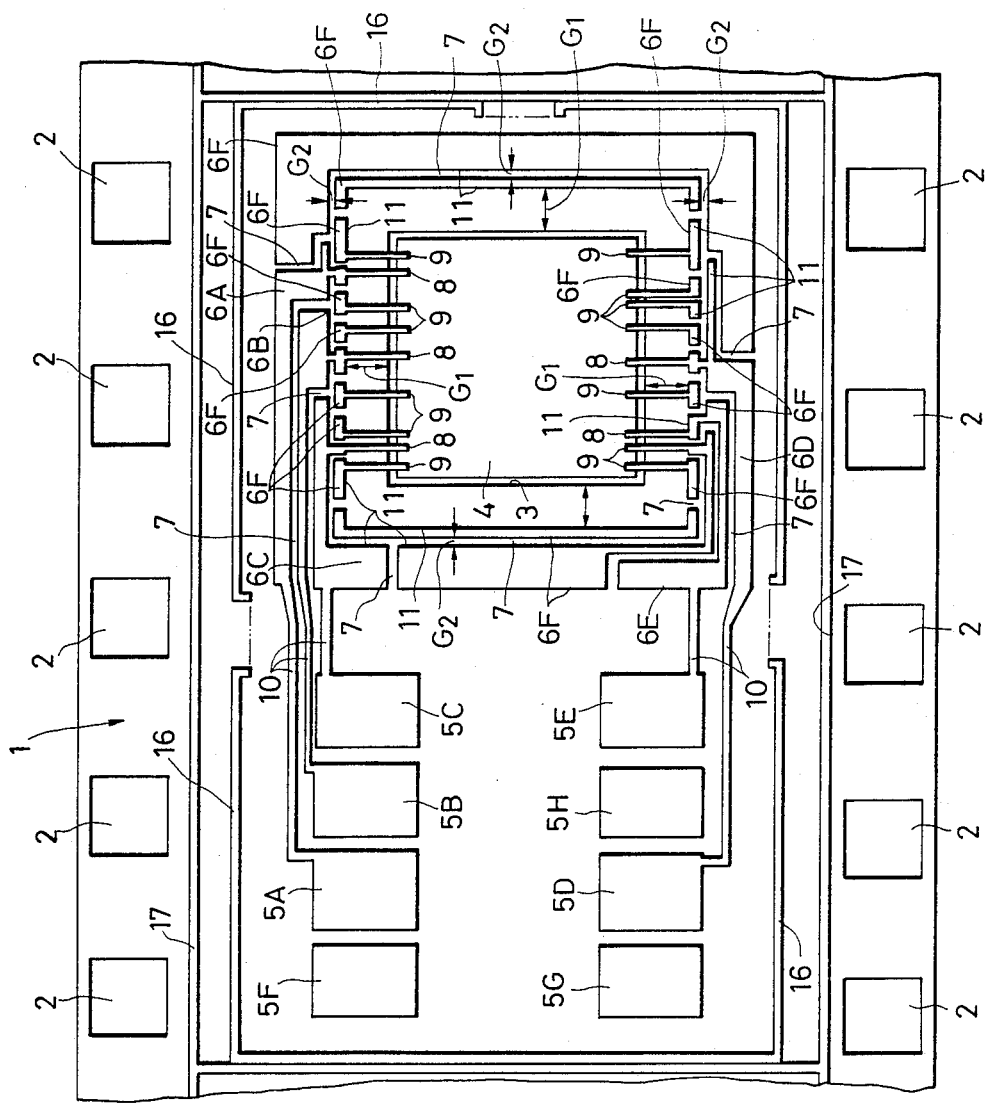
FIG. 1 is a plan view for a tape carrier type semiconductor device as one embodiment according to this invention illustrating the state before resin coating.
Figure 2:
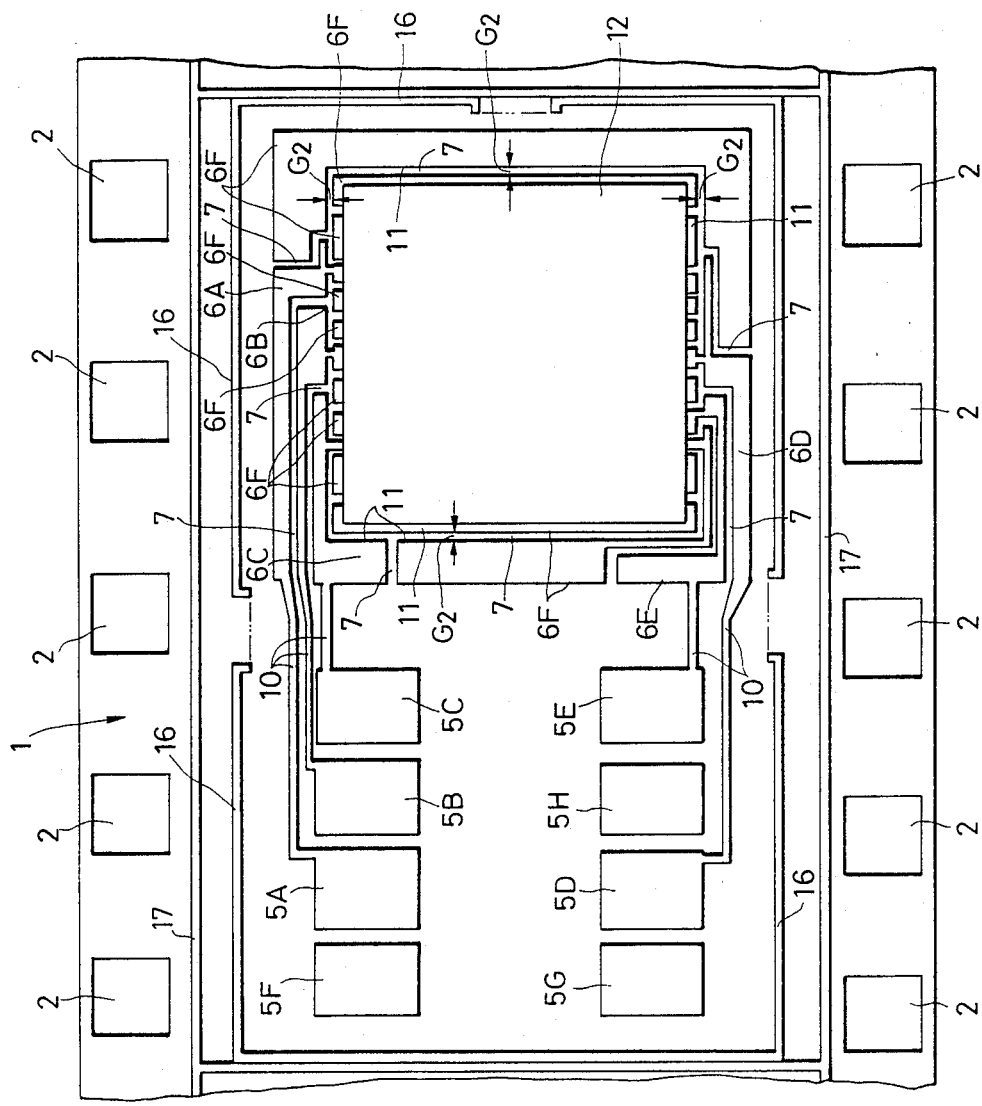
FIG. 2 is a plan view for a tape carrier tape semiconductor device as one embodiment according to this invention illustrating the state after the resin coating.

FIG. 1 is a plan view for a tape carrier type semiconductor device as one embodiment according to this invention illustrating the state before resin coating, FIG. 2 is a plan view for a tape carrier type semiconductor as one embodiment according to this invention illustrating the state after the resin coating, FIG. 3 is a plan view of semiconductor devices illustrating the state where the tape carried state in FIG. 2 is rendered into the state of individual semiconductor devices, and FIG. 4 is a cross sectional view taken along line IV—IV in FIG. 3.

The tape carrier type semiconductor device shown in FIGS. 1 through 4 comprises, as a substrate, an electrically insulating and flexible carrier tape formed into a cinema film-like shape made of polyimide resin, glass epoxy resin, polyester resin or the like with no particular restriction thereto. A plurality of sprocket holes 2 are perforated each at a predetermined pitch on both longitudinal side edges of such a carrier tape 1. Although FIGS. 1-2 illustrate a constitution of one unit at a portion corresponding to one frame of the carrier tape 1, a plurality of such units may be disposed actually in the longitudinal direction of the carrier tape, so that a plurality of tape carrier type semiconductor devices may be formed on one tape.

A tape carrier type semiconductor device shown in FIGS. 3-4 are incorporated to a card substrate of an IC card shown in FIGS. 5 and 6 with no particular restriction, thereby obtaining a semiconductor device as an IC card.

FIG. 5 is a plan view illustrating an IC card and FIG. 6 is a cross sectional view taken along line VI—VI in FIG. 5.

In FIGS. 1 through 4, a chip containing hole 3 is disposed to the carrier tape 1 and has such a size that a semiconductor integrated circuit chip including memory circuits or data processing circuits required for the IC card (hereinafter also simply referred to as an IC chip) 4 can be inserted at a predetermined interval. Such a hole 3 is formed perforated through the right portion of the unitary part in the carrier tape 1. The gap between the IC chip 4 and the hole 3 is set depending on the assembling error upon inserting the IC chip 4 into the hole 3 and bonding the electrodes pad of the IC chip 4 to the lead terminals described later or dimensional error for the outer shape of the IC chip 4 itself.

Electroconductive layers 6A–6F shaped into various wiring patterns as shown in the drawing are formed by way of electroplating or the like to the surface of the carrier tape 1.

The electroconductive layers 6A–6F are made of copper foils, with no particular restriction thereto, and formed with tin or gold plating layers to the respective portions as described later. Such electroconductive layers 6A–6F can be formed, for example, by bonding a copper foil to a thickness, for example, of about 35 $\mu$m on the surface of the carrier tape 1 having a thickness of about 120 $\mu$m formed with various holes such as sprocket holes 2 and the hole 3, selectively applying etching to eliminate the copper foils so as to leave unnecessary patterns as shown in the drawing and, thereafter, selectively plating tin or gold onto the remaining copper foil, that is, the copper foil patterned as shown in the drawing.

According to this embodiment, although not restricted particularly, eight external terminals 5A–5H are formed integrally with each of the electroconductive layers that function as direct external terminals to the IC card on the left part of one unit on the carrier tape 1. The height of the external terminals 5A–5H is made higher than that of the wiring pattern as required, for example, by copper plating or the like. According to the International Standards (IS) in the International Organization for Standarization (ISO), the IC card is specified to have eight external terminals connectable to a processing circuit that receives the inserted card and processes the same. In the case of this embodiment, the external terminals 5A–5E are adapted to function as a terminal for supplying a reference clock signal to the IC chip 4, a terminal for supplying a reset signal, a terminal for supplying one of the reference potentials, a terminal for supplying the other of the referential potentials and a terminal for inputting/outputting serial data to/from the IC chip 4, respectively, although with no particular restrictions thereto. The external terminals 5F–5H are used as backup terminals. The surface portions thereof may be applied with gold plating considering the improvement with respect to the corrosion resistance and reduction of the ohmic contact resistance.

The electroconductive layer 6A–6F surround the hole 3 over a relatively wide range at the surface of the carrier tape 1 around the hole 3 and constitute a substantially a rectangular form as a whole. Those portions at the surface of the carrier tape 1 not formed with the electroconductive layers 6A–6F are regarded as a separation region 7. The width of the separation region 7 is made narrow in the portion at the periphery of the hole 3 as shown in the drawing. A portion for each of the electroconductive layers 6A–6F is protruded to the inside of the hole 3 as lead terminals 8, 9 that can be bonded with electrode pads (not illustrated) such as composed of gold-plated bump electrodes of the IC chip 4. The electroconductive layers 6A–6F are constituted with copper foils applied with tin plating and formed into an identical film thickness respectively. The lead terminals 8 and 9 and a plurality of electrode pads (not shown) of the IC chip 4 are bonded simultaneously with each other by the use of an appropriate bonding tool. That is, the IC chip 4 is inserted from the rear side of the carrier tape 1 to the hole 3 thereof and, when the lead terminals 8 and 9 are pressed and heated by means of the bonding tool (not illustrated) to each of the electrodes pads of the IC chip 4, they become bonded by means of eutectic alloys of gold and tin formed thereby. In this case, respective desired portions of 6A–6E among 6A–6F of the electroconductive layers are made into wiring layers 10 and bonded to the external terminals 5A–5E respectively. The lead terminals 8, protruded from the electroconductive layers 6A–6E and which correspond to respective external terminals 5A–5E, are bonded to the electrode pads of the IC chip 4. According to FIG. 1, the electroconductive layer 6F is not bonded with an external terminal of the IC card. Therefore, the lead terminal 9 protruded from the electroconductive layer 6F is not used for the actual data processing in view of the function of the IC card. However, such a lead terminal 9 has a structural dynamic function for increasing the strength of supporting the semiconductor chip 4 on the carrier tape 1 and, further, has a function of enabling the electroconductive layer 6F connected with the lead terminal 9 to be used as the testing electrode for testing the IC chip 4 on the carrier tape 1.

Now, the pattern constitution for the electroconductive layers 6A–6F around the hole 3 will be described more specifically.

The electroconductive layers 6A–6F are patterned at the periphery of the hole 3 so as to substantially surround the circumferential edge of the hole 3 at a predetermined gap G1. Such a pattern is formed by the selective etching of copper foils in accordance with this embodiment, in which the gap G1 and the separation region 7 are the portions to be removed by the selective etching. According to this embodiment, a substantially rectangular portion to be removed is formed at a further gap G2 at a distance further away from the chip than is gap G1, and both of these removed portions constitute a double structure around the hole 3 which is the center. The gaps G1 and G2 are made smaller than the width for the shorter side of the electroconductive layers 6A–6F.

At the respective removed portions comprising the gaps G1 and g2, the steps 11 are formed with the electroconductive layers 6A–6F and the surface of the carrier tape 1, respectively. Such steps 11 constitute a barrier portion, as shown in FIGS. 2–4, that control the flowing range or the coating range of the coating material 12 before coagulation and function as a flow stop for the coating material 12.

Since the space surrounded by the steps 11 as the barrier portion is in the form of a recess in accordance with the size of the film thickness of the electroconductive layers 6A–6F, when the surface of the IC chip 4 bonded with the lead terminals 8 and 9 is coated with the coating material 12 made of a synthetic resin, the flowing range of the coating material 12 is controlled by the steps 11 as the barrier so that only the space surrounded by the steps 11 are filled with the coating material 12 and the IC chip 4 and the periphery thereof are completely coated. The coating material 12 applied is cured by the subsequent heat treatment or the like. In this way, the steps 11 as the barrier surrounding the removed portion formed by the gap G1 favorably control the flowing or the coating range of the coating material 12 to inhibit irregular flowing diffusion of the coating material 12. Accordingly, the coating range with the coating material 12 is made uniform and the scattering in the film thickness is minimized between each of the respective semiconductive devices. The specific embodiment for the coating material 12 is an epoxy resin.

In this case, the extent of the removed portion formed by the gap 11 is adequately predetermined depending on the coating film thickness of the coating material 12 and the flowing property of the coating material or the like, but the coating material 12 may sometimes flow outwardly beyond the removed portion constituted with the gap G1 as a result of an error in the coating amount of the coating material 12 and the temperature dependency of the flowing property of the coating material 12. In this case, the steps 11 as the barrier surrounding the removed portion comprising the gap G2 at the outer side thereof further control the flowing or the coating range of the protruded coating material.

A separation recess 16 is formed on the carrier tape 1 around main portions such as the external terminals 5A–5H and the electroconductive layers 6A–6F so as to substantially surround the four sides thereof and is supported at the inner portions thereof, for example, at three points. According to this embodiment, when the portion surrounded by the separation recess 16 is cut and separated from the regions supported by three points at the positions shown by the dotted chain, the cut and separated portion is mounted on one IC card in FIG. 5. Although there are no particular restrictions for the mounting technique to the IC card 18, it can be mounted by inserting the cut and separated portion from the carrier tape 1 into a through hole in a card substrate 19 made of resin, covering both surfaces of the card substrate 19 in this state with a thin plate 20 made of resin so as to expose the external terminals 5A–5H and thereby securing the card substrate 19 and the thin plate 20 integrally by means of heat bonding or the like. In this case, since the coating range and the film thickness of the coating material 12 are made uniform by the effect of the electroconductive layers 6A–6F and the steps 11 as the barrier, the surface near the IC chip 4 particularly tending to form unevenness on the surface is made considerably flat favorably. As a result, there is no local unevenness formed at the surface of the IC card 18 and, if magnetic stripe 21 is formed on the surface just above the portion coated by the coating material 12, the magnetic reading from that portion is not hindered since the portion is flat.

The periphery for each of the units in the semiconductor device is surrounded with a wiring layer 17 formed simultaneously with each of the electroconductive layers 6A–6F and, in addition, the wiring layer 17 is connected to each of the external terminals 5A–5H before the forming of the separation recess 16. The wiring layer 17 does not function when mounted on the IC card but functions as an electroconductive path upon forming electric plating to the electroconductive layers 6A–6F, etc. Further, the barrier portion may be formed with other material such as insulating tape instead of the material identical with that of the wiring pattern.

According to the above-mentioned embodiment, the following advantages can be obtained.

(1) The steps 11 as the barrier surrounding the removed portion formed by the gap G1 favorably control the flowing range or the coating range of the coating material 12 thereby inhibiting irregular flowing diffusion of the coating material 12.

(2) Even in a case where the coating material 12 protruded to the outside of or beyond the removed portion constituted with the gap G1 as a result of an error in the amount of coating coating material 12, or temperature dependency of the flowing property of the coating material 12, the steps 11 as the barrier surrounding the outer side of the removed portion corresponding to the gap G2 can further control the flowing range or the coating range of the coating material.

(3) According to the effects (1), (2) above, the coating range with the coating material can be made unifom and scattering in the film thickness can be minimized between each of the semiconductor devices.

(4) Since the coating range and the coating thickness of the coating material is unified by the effect of the electroconductive layers 6A–6F and the steps 11 as the barrier and, particularly since, the surface near the IC chip 4 tending to be uneven is made considerably flat, there is no local unevenness formed on the surface of the IC card when the semiconductor device becomes applied to the IC card by inserting a main portion cut and separated from the carrier tape 1 into a card substrate and securing both of the surfaces of the card substrate, in this state, with a thin plate made of resin. In addition, if a magnetic stripe is formed over the surface just above the coating portion by the coating material, the magnetic reading from that portion is not hindered since that portion is flat.

(5) Particularly, if the barrier portion is formed by utilizing the electroconductive layers 6A–6F, the barrier portion can be formed easily and simultaneously with a predetermined electroconductive pattern by way of selective etching or the like.

Although this invention made by the present inventors has been described in terms of specific embodiments, this invention is no way to be construed as being limited only to the above-mentioned embodiments but can be modified in various ways within the scope of the invention as defined by the appended claims.

For instance, the barrier which is formed with a portion of the electroconductive layers in the above-mentioned embodiment, may also be constituted by bonding an insulating resin film. Further, the barrier, although restricted to the double structure as in the foregoing embodiment, may also be a single structure, or triple- or more multiple-structure.

Further, although the above detailed explanation has been made with respect to a semiconductor device having external terminals for use in an IC card, the present invention is no way limited to such but may also be applied to a semiconductor device constituted for example, with external terminal leads for use in TAB (tape automated bonding), external terminals for forming dual in line, or external terminal leads for quad in line.

Although the invention made by the present inventors has been explained mainly in the case where it is applied to an IC card which constitutes the application field of the background, it is not to be considered as being restricted to such but the invention is also applicable to a module-structured semiconductor device having various electrical functions capable of mounting a semiconductor device which requires control of the coating range of the coating material and of the surface flatness thereof.

For instance, there can be mentioned a semiconductor device for use in portable electronic calculators, and semiconductor devices for use in wrist watch. This invention is applicable at least to those of the conditions where the IC chip inserted into the hole is coated with coating material.

Explanation will be made briefly as to the effect obtained by typical embodiments of the invention disclosed in the present application as described below.

That is, since a gap which is constituted with the surface of a carrier tape and electroconductive layers which are made of the same material as that of the electroconductive patterns the formed on the surface of the carrier tape, so as to substantially surround the circumferential edge of the hole for containing an IC chip and separated therefrom with a predetermined gap, the flowing range or the coating range of the coating material before coagulation is controlled by such steps, whereby the coating region at the surface of the IC chip, etc. with the coating material can be made uniform and the scattering in the film thickness can be minimized between each of the carrier tape type semiconductor devices.

Example 2

The outline of the semiconductor device in this Example 2 is briefly explained below.

That is, each of the leads is formed in a broad width shape such that the gap between each of the leads at the portion at least formed on the wiring substrate is made narrow among the leads extended from the surface of the wiring substrate to the upper portion of the hole.

According to the means as described above, since unevenness caused upon formation of the leads can be prevented at the surface of the wiring substrate, the flatness at the card surface can be maintained upon actual mounting of the wiring substrate.

Figure 7:
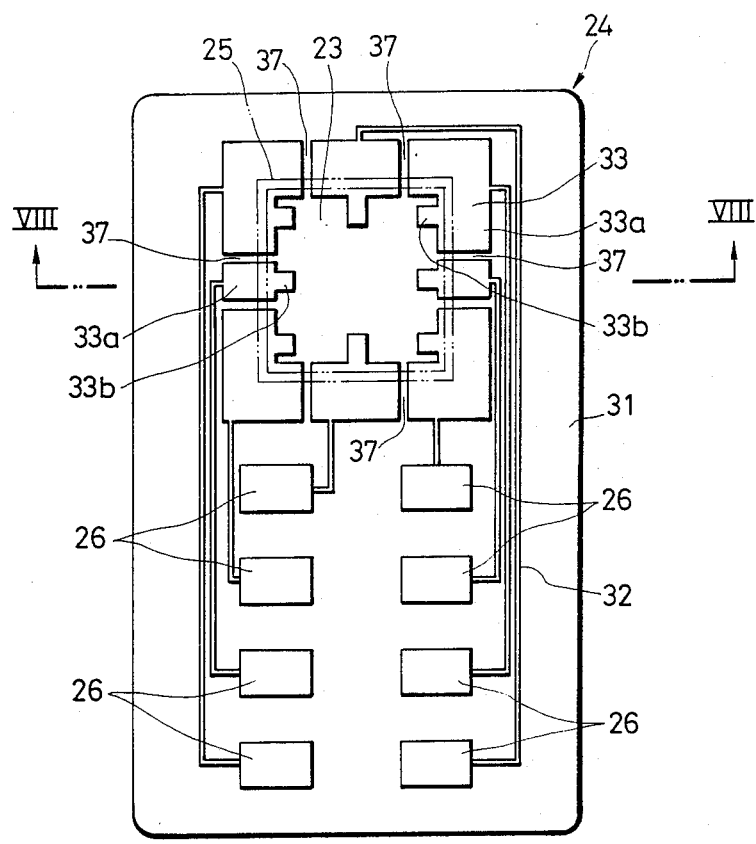
FIG. 7 is a plan view illustrating a semiconductor device as another embodiment according to this invention.

FIG. 7 is a plan view illustrating a semiconductor device as another emboidment according to this invention.

Figure 8:
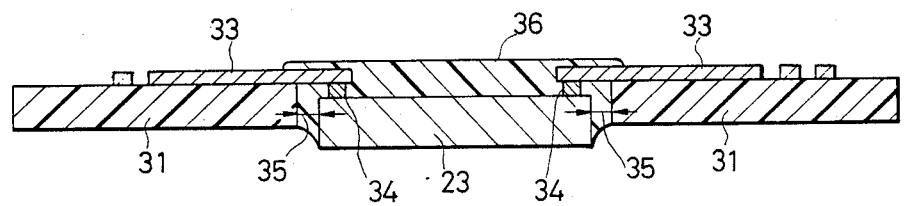
FIG. 8 is a cross sectional view taken along line VIII—VIII in FIG. 7.

FIG. 8 is a cross sectional view taken along line VIII—VIII.

FIG. 9 is a plan view illustrating an IC card incorporated with the semiconductor device shown in FIG. 7.

FIG. 10 is a cross sectional view taken along line X—X in FIG. 9.

The semiconductor device of Example 2 constitutes a so-called IC card 22. The planar shape of the IC card 22 is as shown in FIG. 7 and it has a rectangular configuration with its four corners being cut and formed.

An IC pellet (IC chip) 23 is built into the IC card 22 in a state contained in a rectangular IC pellet insertion hole 25 formed to a wiring substrate 24 as shown in FIGS. 7 and 8, and external electrodes 26 formed to the wiring substrate 24 are exposed to the card surface.

The IC card 22 has such a cross sectional structure as shown in FIG. 10 that the wiring substrate 24 securing the IC chip is mounted to the inside and both of the surface and the rear face of the card substrate 29 is laminated with film-like over sheets 27,28 made of rigid polyvinyl chloride resin. A magnetic stripe 30 is embedded by lamination just above the IC pellet 23 although it is not particularly limited to it.

The wiring substrate 24 has a structure as shown in FIGS. 7-8. That is, printed wiring or metallized wiring 32 made of electroconductive material such as copper foil is formed on the surface of an insulation substrate 31 made of glass epoxy resin or the like and external terminals 26, as has been described above, are disposed to one end of the metallized layer wirings 32. The surface of the external electrodes 26 may be deposited with gold (Au) for preventing corrosion for reducing ohmic resistance. Further, a pellet mounting hole 25 having an opening slightly larger than the cross sectional shape of the IC pellet 23 is formed penetrating the insulation substrate 31 in the direction of the thickness at a portion of the insulation substrate 31.

A plurality of leads 33 are extended at the surface of the insulation substrate 31 from the periphery of the pellet mounting hole 25 so as to overlie the circuit forming surface of the IC pellet 23. The top ends of the leads 33 are electrically in contact with the pad of the IC pellet 23 by way of bump electrodes 34 as shown in FIGS. 7-8, respectively, wherein the IC pellet 23 is maintained at a predetermined position in the inside of the pellet mounting hole 25 by the leads 33. Further, the leads 33 are electrically connected with the metallized layer wiring 32 at the surface of the insulation substrate 31, by which the IC pellet 23 is electrically connected with the external electrodes 26.

By the way, the lead 33 disposed on the insulation substrate 31 has a broad width portion 33a at its base portion, that is, the portion deposited to the surface of the periphery of the pellet mounting hole 25, which forms only a slight gap as an insulation space to the broad width portion 33a of other adjacent lead 33. Further, while the broad width portion 33, as shown in FIGS. 7-8, is continuous to the upper surface of the IC pellet 23 so as to cover or overlie the upper portion of a gap 35 formed between the inner side of the pellet mounting hole 25 and the outer side of the pellet 23, the width is narrowed to constitute a narrow width portion 33b near the juncture with the bump electrode 34 on the side of the IC pellet 23.

The circuit-forming surface of the IC pellet 23 is coated with coating material or surface protecting material 36 made of an epoxy resin as shown in FIG. 8 so as to protect the surface of the pellet 23. The surface protecting material 36 is deposited, for example, by dropping liquid-like epoxy resin to a predetermined position on the IC pellet 23 and the leads 33 for several times over the entire coating region and, thereafter, forming a surface protecting layer of a predetermined film thickness and then curing the epoxy resin under heating at a predetermined temperature. Upon curing the epoxy resin, if the surface of the insulation substrate 31 is substantially uneven by the leads 33, such unevenness also appears on the surface of the cured epoxy resin to often give an undesirable effect to the flatness of the IC card 22. Particularly, at the mounting position of the wiring substrate 24 securing the IC pellet to the IC card 22, for example, at a position where the IC pellet 23 is situated below a magnetic stripe 30 as shown in FIGS. 9-10, there is a possibility of causing error upon reading the information recorded in the magnetic stripe 30 because of the unevenness at the surface of the wiring substrate 24.

In this embodiment, however, the broad width portion 33a is formed at the portion of the lead 33 on the insulation substrate 31 and only a small gap 37 is present as an insulation space between the broad width portion 33a and other adjacent broad width portions 33a. Since the gap 37 is made smaller than the width for each of the leads 33, the leads 33 are entirely formed as a substantially flat surface. Accordingly, upon depositing the coating material 36 such as epoxy resin on the leads 33, the surface of the coating material 36 can be kept flat.

Furthermore, since the broad width portion 33a of the lead 33 is formed so as to cover the gap 35 between the pellet 23 and the pellet mounting hole 25, it is possible to effectively prevent the occurrence of unevenness to the surface of epoxy resins 36 filled in the gap 35 between the pellet 23 and the pellet mounting hole 25 upon curing due to the shrinkage of the epoxy resin 36.

As has been described above, the following advantageous effects can be obtained according to this embodiment.

(1) Since the lead structure is so adapted that the lead portion at the surface around the pellet mounting hole 25 of the base substrate 31 constituting the wiring substrate 24 is formed as the broad width portion 33a and the gap 37 between the broad width portions 33a of the adjacent leads is narrow, it is possible to prevent the occurrence of surface unevenness due to the thickness of the leads 33 and maintain the surface flatness of the IC card 22 constant.

(2) Since the broad width portions 33a of the leads 33 are extended as far as the portion above the IC pellet 23, the portion above the gap 35 between the IC pellet 23 and the pellet mounting hole 25 can be covered, by which it is possible to prevent the occurrence of surface unevenness in the IC card due to shrinkage of the epoxy resin 36 filled in the gap 35.

(3) Since the broad width portions 33a are disposed to the portion of the leads formed to the surface of the insulation substrate 31, it is possible to maintain the holding of the IC pellet 23 by the leads 33 at a high strength.

(4) According to (1)-(3) above, the IC card 22 of high reliability can be provided.

Although, the invention made by the present inventors has been described with respect to specific embodiments, this invention should not be considered as being limited only to the foregoing embodiments but can of course be exemplified by other embodiments and modification therefrom without departing the from the scope of the invention as defined by the appended claims.

For instance, although the explanations have been made for the case where the juncture between the leads and the IC pellet bank electrodes is constituted in a narrow-width shape, the leads may be extended as they are in the broad width shape also in the junctured portion.

Although the explanations have been made for the invention made by the present inventors mainly to a so-called IC card as the application field thereof, the invention is no way limited only thereto but it is also applicable to semiconductor devices of module structure having other various electrical functions such as sheet-like thin portable electronic calculator pocket computer or wrist watch module.

A brief explanation will be given as to the effects obtained by typical embodiments of the invention disclosed in the present application.

Since the semiconductor device has such a structure as comprising a predetermined wiring substrate and an IC pellet contained in the hole formed in the wiring substrate, in which the IC pellet is held in the hole by leads of the wiring pattern extended from the surface of the wiring substrate to the portion above the hole, and since each of the leads is formed in a broad width shape such that the gap between each of them is made narrow in the portion of the leads at least formed on the hole, it is possible to prevent the occurrence of unevenness due to the formation of leads at the surface of the wiring substrate and, accordingly, the surface flatness of the card can be maintained upon actual mounting of the wiring substrate.

What is claimed is:

1. A semiconductor device comprising a wiring substrate in which wiring patterns having a plurality of leads electrically connected with a plurality of electrical pads of an IC chip and wirings for electrically connecting said leads with external electrodes are formed at the surface of an insulation medium and an IC chip contained within a hole of said wiring substrate which is formed for inserting said IC chip in said wiring substrate, the plurality of electrode pads of said IC chip and the plurality of leads of said wiring substrate being respectively electrically connected with each other, and the entire surface of said IC chip and the corresponding periphery thereof, extending partly unto said wiring substrate, being coated with a surface protecting layer made of resin, wherein there is further included a plurality of leads respectively extending from the surface of said wiring substrate to a portion above said hole and each being in contact with a corresponding one of said plurality of electrode pads of said IC chip which is contained within said hole, and barrier portions which are formed along the surface of said wiring substrate adjacent to the circumferential edge of said hole for controlling and limiting the outwardly flowing range of said protecting layer at the surface of said wiring substrate before coagulation of the surface protecting resin material.

2. A semiconductor device according to claim 1, including a plurality of barrier portions disposed so as to surround the circumferential edge of said hole and being separated from said hole by a predetermined gap.

3. A semiconductor device according to claim 1, including a plurality of barrier portions disposed so as to surround the circumferential edge of said hole and being separated from said hole by a predetermined gap, and a plurality of lead terminals made of the same material as that of said barrier portions extending from said plurality of barrier portions to the inside of said hole and in contact with said IC chip so as to fixedly secure said IC chip.

4. A semiconductor device according to claim 1, wherein said barrier portions are made of the same material as that used for the wiring pattern at the surface of said wiring substrate.

5. A semiconductor device according to claim 1, wherein the wiring substrate is a tape carrier type.

6. A semiconductor device according to claim 1, wherein the surface protecting layer is made of epoxy resin.

7. A semiconductor device of a module structure incorporating a device having electric functions, said device comprising a wiring substrate in which wiring patterns having a plurality of leads electrically connected with a plurality of electrical pads of an IC chip and wirings for electrically connecting said leads with external electrodes are formed at the surface of an insulation medium and an IC chip contained within a hole of said wiring substrate which is formed for inserting said IC chip in said wiring substrate, the plurality of electrode pads of said IC chip and the plurality of leads of said wiring substrate being respectively electrically connected with each other, and the entire surface of said IC chip and the corresponding periphery thereof, extending partly unto said wiring substrate, being coated with a surface protecting layer made of resin, wherein there is further included a plurality of leads respectively extending from the surface of said wiring substrate to a portion above said hole and each being in contact with a corresponding one of said plurality of electrode pads of said IC chip which is contained within said hole, and barrier portions which are formed along the surface of said wiring substrate adjacent to the circumferential edge of said hole for controlling and limiting the outwardly flowing range of said protecting layer at the surface of said wiring substrate before coagulation of the surface protecting resin material.

8. A semiconductor device according to claim 7, including a plurality of barrier portions disposed so as to surround the circumferential edge of said hole and being separated from said hole by a predetermined gap.

9. A semiconductor device according to claim 7, including a plurality of barrier portions disposed so as to surround the circumferential edge of said hole and being separated from said hole by a predetermined gap, and a plurality of lead terminals made of the same material as that of said barrier portions extending from said plurality of barrier portions to the inside of said hole and in contact with said IC chip so as to fixedly secure said IC chip.

10. A semiconductor device according to claim 7, wherein the barrier portions are made of the same material as that used for the wiring pattern at the surface of the wiring substrate.

11. A semiconductor device according to claim 7, wherein the wiring substrate is a tape carrier type.

12. A semiconductor device according to claim 7, wherein the surface protecting layer is made of epoxy resin.

13. A semiconductor device according to claim 7, wherein the semiconductor device of module structure is an IC card.

14. A semiconductor device according to claim 7, wherein the semiconductor device of a module structure is a portable electronic calculator.

15. A semiconductor device according to claim 7, wherein the semiconductor device of a module structure is a wrist watch.

16. A semiconductor device comprising a wiring substrate in which wiring patterns having a plurality of leads electrically connected with a plurality of electrical pads of an IC chip and wirings for electrically connecting said leads with external electrodes are formed at the surface of an insulation medium and an IC chip contained within a hole of said wiring substrate which is formed for inserting said IC chip in said wiring substrate, the plurality of electrode pads of said IC chip and the plurality of leads of said wiring substrate being respectively electrically connected with each other, and the entire surface of said IC chip and the corresponding periphery thereof being coated with a surface protecting layer made of resin, wherein there is further included a plurality of leads each extending from the surface of said wiring substrate to a portion above said hole and each being in contact with a corresponding one of said plurality of electrode pads of said IC chip which is contained within said hole, wherein the width of each one of the leads formed is broad and is such that the gap between each of the leads at the periphery of said hole is made smaller than the width of each of said leads.

17. A semiconductor device according to claim 16, wherein the wiring substrate is a tape carrier type.

18. A semiconductor device according to claim 16, wherein the broad width portion of each of the leads extends as far as said portion above said hole formed for inserting the IC chip of the wiring substrate.

19. A semiconductor device according to claim 16, wherein the broad width portion of each of the leads is disposed at least as far as the periphery of the hole for inserting the IC chip in the wiring substrate, and wherein that portion of each of said leads extending as far as said portion above said hole having a smaller width than that portion of each lead adjacent to and beyond the periphery of said hole.

20. A semiconductor device according to claim 16, wherein the broad width portion of each of the leads is disposed at least as far as the periphery of the hole for inserting the IC chip in the wiring substrate, and wherein that portion of each said leads extending as far as said portion above said hole having a smaller width than that portion of each lead adjacent to and beyond the periphery of said hole, the boundary region between the broad width portion and the narrow width portion corresponding to each of said leads substantially defines the coating region for the surface protecting resin layer.

21. A semiconductor device as defined in claim 16, wherein the surface protecting layer made of resin is an epoxy resin.

22. A semiconductor device of a module structure incorporating a device having electric functions, said device comprising a wiring substrate in which wiring patterns having a plurality of leads electrically connected with a plurality of electrical pads of an IC chip and wirings for electrically connecting said leads with external electrodes are formed at the surface of an insulation medium and an IC chip contained within a hole of said wiring substrate which is formed for inserting said IC chip in said wiring substrate, the plurality of electrode pads of said IC chip and the plurality of leads of said wiring substrate being respectively electrically connected with each other, and the entire surface of said IC chip and the corresponding periphery thereof being coated with a surface protecting layer made of resin, wherein there is further included a plurality of leads each extending from the surface of said wiring substrate to a portion above said hole and each being in contact with a corresponding one of said plurality of electrode pads of said IC chip which is contained within said hole, wherein the width of each one of the leads formed is broad and is such that the gap between each of the leads at the periphery of said hole is made smaller than the width of each of said leads.

23. A semiconductor device of module structure according to claim 22, wherein the wiring substrate is a tape carrier type.

24. A semiconductor device according to claim 22, wherein the semiconductor device of a module structure is an IC card.

25. A semiconductor device according to claim 22, wherein the semiconductor device of a module structure is a portable electronic calculator.

26. A semiconductor device according to claim 22, wherein the semiconductor device of a module structure is a wrist watch.

27. A method of manufacturing a semiconductor device which comprises preparing a wiring substrate having a wiring pattern including a plurality of leads electrically connected with a plurality of electrode pads of an IC chip and wirings for electrically connecting said leads with external electrodes, formed at the surface of an insulation substrate, enhousing said IC chip into a hole formed for inserting said IC chip in said wiring substrate, electrically connecting a plurality of electrode pads of said IC chip with a plurality of leads of said wiring substrate, coating said IC chip and the peripheral region thereof, extending partly into said wiring substrate, with surface coating material made of resin and then applying heat treatment to cure said surface coating material thereby forming a surface protecting layer, wherein barrier portions are formed along the surface of the wiring substrate adjacent to the circumferential edge of said hole for controlling and limiting the outwardly flowing range of said surface protection resin material at the surface of said wiring substrate before coagulation.

28. A method of manufacturing a semiconductor device according to claim 27, wherein a plurality of barrier portions are formed and are disposed so as to surround the circumferential edge of said hole and are separated therefrom by a predetermined gap.

29. A method of manufacturing a semiconductor device according to claim 27, wherein a plurality of barrier portions are formed and are disposed so as to surround the circumferential edge of said hole and are separated therefrom by a predetermined gap, and further including a plurality of lead terminals made of the same material as that of said barrier portions extending from said plurality of barrier portions to the inside of said hole and being fixedly secured to said IC chip.

30. A method of manufacturing a semiconductor device according to claim 27, wherein said barrier portions are made of the same material as that used for the wiring pattern at the surface of said wiring substrate.

31. A method of manufacturing a semiconductor device according to claim 27, wherein the wiring substrate is a tape carrier type.

32. A method of manufacturing a semiconductor device according to claim 27, wherein the surface protecting layer is made of epoxy resin.

33. A method of manufacturing a semiconductor device of a module structure in which a device having a wiring substrate attached with an IC chip is incorporated into a substrate having an electrical function, by using the device having said wiring substrate attached with said IC chip of a structure comprising a wiring substrate in which wiring patterns having a plurality of leads electrically connected with a plurality of electrical pads of an IC chip and wirings for electrically connecting said leads with external electrodes are formed at the surface of an insulation substrate and an IC chip contained within a hole of said wiring substrate which is formed for inserting said IC chip in said wiring substrate, said plurality of electrode pads of said IC chip and said plurality of leads of said wiring substrate being respectively electrically connected with each other, and the entire surface of said IC chip and the periphery thereof, extending partly unto said wiring substrate, being coated with a surface protecting layer made of resin, wherein there is further included a plurality of leads respectively extending from the surface of said wiring substrate to a portion above said hole and each being in contact with a corresponding one of said plurality of electrode pads of said IC chip which is contained within said hole, and barrier portions which are formed along the surface of said wiring substrate adjacent to the circumferential edge of said hole for controlling and limiting the outwardly flowing range of said protecting layer at the surface of said wiring substrate before coagulation of the surface protecting resin material.

34. A method of manufacturing a semiconductor device according to claim 33, including a plurality of barrier portions disposed so as to surround the circumferential edge of said hole and being separated from said hole by a predetermined gap.

35. A method of manufacturing a semiconductor device according to claim 33, including a plurality of barrier portions disposed so as to surround the circumferential edge of said hole and being separated from said hole by a predetermined gap, and a plurality of lead terminals made of the same material as that of said barrier portions extending from said plurality of barrier portions to the inside of said hole and in contact with said IC chip so as to fixedly secure said IC chip.

36. A method of manufacturing a semiconductor device according to claim 33, wherein said barrier portions are made of the same material as that used for wiring pattern at the surface of said wiring substrate.

37. A method of manufacturing a semiconductor device according to claim 33, wherein the wiring substrate is a tape carrier type.

38. A method of manufacturing a semiconductor device according to claim 33, wherein the surface protecting layer is made of epoxy resin.

39. A method of manufacturing a semiconductor device of a module structure according to claim 33, wherein the semiconductor device is an IC card.

40. A method of manufacturing a semiconductor device of a module structure according to claim 33, wherein the semiconductor device is a portable electronic calculator.

41. A method of manufacturing a semiconductor device of a module structure according to claim 33, wherein the semiconductor device is a wrist watch.

* * * * *